(12) United States Patent
Liu et al.

(10) Patent No.: US 10,734,415 B1
(45) Date of Patent: Aug. 4, 2020

(54) DISPLAY PANEL AND DISPLAY DEVICE

(71) Applicant: Shanghai Tianma AM-OLED Co.,Ltd., Shanghai (CN)

(72) Inventors: Xinzhao Liu, Shanghai (CN); Kaihong Huang, Shanghai (CN); Min Chen, Shanghai (CN); Lin Cheng, Shanghai (CN); Zhuan Gao, Shanghai (CN); Ciyi Gu, Shanghai (CN); Jing Lv, Shanghai (CN); Haoshen Wang, Shanghai (CN); Qingxia Wang, Shanghai (CN); Xiaoyu Wang, Shanghai (CN); Zi Xu, Shanghai (CN); Jiayao Yang, Shanghai (CN); Qian Zhang, Shanghai (CN); Peng Zhang, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/394,119

(22) Filed: Apr. 25, 2019

(30) Foreign Application Priority Data

Jan. 30, 2019 (CN) .......................... 2019 1 0089975

(51) Int. Cl.
*H01L 27/12* (2006.01)
*G09G 3/3275* (2016.01)
*G09G 3/36* (2006.01)

(52) U.S. Cl.
CPC ......... *H01L 27/124* (2013.01); *G09G 3/3275* (2013.01); *G09G 3/3688* (2013.01)

(58) Field of Classification Search
CPC ... H01L 27/124; G09G 3/3688; G09G 3/3275
See application file for complete search history.

(56) References Cited

U.S. PATENT DOCUMENTS

| 10,177,177 | B2 * | 1/2019 | Lee ..................... H01L 27/1248 |
| 2006/0001803 | A1 * | 1/2006 | Park ..................... G02F 1/13458 |
| | | | 349/113 |
| 2007/0070282 | A1 * | 3/2007 | Shibahara ......... G02F 1/134363 |
| | | | 349/141 |
| 2011/0156995 | A1 * | 6/2011 | Choi ................... H01L 27/1288 |
| | | | 345/92 |

FOREIGN PATENT DOCUMENTS

| CN | 104701352 A | 6/2015 |
| CN | 107610635 A | 1/2018 |

* cited by examiner

*Primary Examiner* — Karen Kusumakar
(74) *Attorney, Agent, or Firm* — Anova Law Group PLLC

(57) ABSTRACT

Display panel and display device are provided. The display panel includes a display region; a non-display region; and a notch. Data lines are disposed in the display region. An edge of the display panel recesses toward the display region to form the notch. The display region includes a first display region and second display regions. The notch and the first display regions are disposed between two second display regions in the first direction and are adjacent in the second direction. The data lines include first data lines in each of the second display regions separated by the notch. Connection lines are disposed surrounding the at least one notch, and each connection line connects two of the first data lines in a same column and on two sides of the notch At least a portion of the connection lines includes first segments disposed in the first display region.

20 Claims, 15 Drawing Sheets

DISPLAY PANEL AND DISPLAY DEVICE

CROSS-REFERENCES TO RELATED APPLICATION

This application claims the priority of Chinese Patent Application No. 201910089975.9, filed on Jan. 30, 2019, the content of which is incorporated herein by reference in its entirety.

TECHNICAL FIELD

The present disclosure generally relates to the field of display technology and, more particularly, relates to a display panel and a display device.

BACKGROUND

As display technologies are applied in smart wearable electronic devices and other portable electronic devices, a design of electronic products is constantly pursuing a smooth user experience and also users' sensory experience. For example, performances including a wide view angle, a high resolution, a narrow border, and a high screen ratio, become selling points of various electronic products.

There is a need to solve technical problems to provide a display panel and a display device with a narrow border and a high screen ratio.

SUMMARY

One aspect of the present disclosure provides a display panel. The display panel includes a display region, a non-display region surrounding the display region, and at least one notch. A plurality of data lines is disposed in the display region and extends along a first direction. An edge of the display panel recesses in a second direction toward an inside of the display region to form the at least one notch, the second direction intersecting the first direction. The display region includes a first display region and second display regions, the second display regions including a first second-display region and a second second-display region. The at least one notch and the first display region are disposed between the first and second second-display regions in the first direction. The at least one notch and the first display region are adjacent to each other in the second direction. The plurality of data lines includes first data lines in each second display region separated by the at least one notch. Along the first direction, connection lines are disposed surrounding the at least one notch, and each connection line connects two of the first data lines in a same column and on two sides of the at least one notch, and at least a portion of the connection lines includes a first segment disposed in the first display region.

Another aspect of the present disclosure provides a display device. The display device includes a display panel provided by various embodiments of the present disclosure. The display panel includes a display region, a non-display region surrounding the display region, and at least one notch. A plurality of data lines is disposed in the display region and extends along a first direction. An edge of the display panel recesses in a second direction toward an inside of the display region to form the at least one notch, the second direction intersecting the first direction. The display region includes a first display region and second display regions, the second display regions including a first second-display region and a second second-display region. The at least one notch and the first display region are disposed between the first and second second-display regions in the first direction. The at least one notch and the first display region are adjacent to each other in the second direction. The plurality of data lines includes first data lines in each second display region separated by the at least one notch. Along the first direction, connection lines are disposed surrounding the at least one notch, and each connection line connects two of the first data lines in a same column and on two sides of the at least one notch, and at least a portion of the connection lines includes a first segment disposed in the first display region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
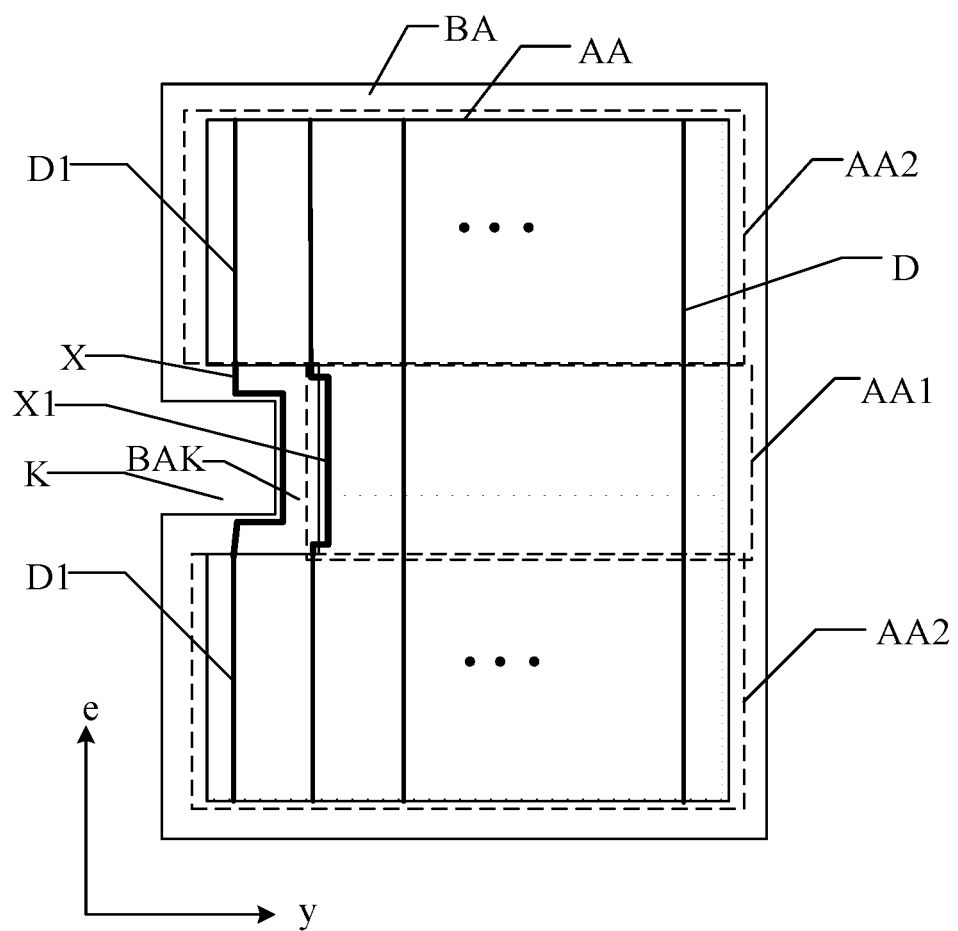
FIG. 1 illustrates an exemplary display panel consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

FIG. 1 illustrates an exemplary display panel consistent with various disclosed embodiments in the present disclosure. As illustrated in FIG. 1, the display panel may include a display region AA, a non-display region BA surrounding the display region AA, and at least one notch K. For description purposes only, the embodiments with one notch K will be used as examples to illustrate the present disclosure, and should not limit scopes of the present disclosure, and should not limit the scopes of the present disclosure. The display region AA may include a plurality of data lines extending along a first direction e. An edge of the display panel may recess toward an inside of the display region AA along a second direction y to form the notch K. The second direction y may intersect the first direction e. The display region AA may include a first display region AA1 and second display regions AA2. The second display regions AA2 may include a first second-display region and a second second-display region. Along the first direction e, the notch K and the first display region AA1 may be disposed between the first and the second second-display regions AA2. Size and a number of pixels in the second display regions AA2 may or may not be same. The first display region AA1 may be adjacent to the notch K along the second direction y. The plurality of data lines D may include first data lines D1 in each of the second display regions AA2. The first data lines D1 in each of the second display regions AA2 may be separated by the notch K. The plurality of data lines D may further include data lines across the first display region AA1 and the second display region AA2. The display panel may further include connection lines X. The connection lines X may be disposed around the notch K. Each connection line X may connect two of the first data lines D1 in a same column and at two sides of the notch K respectively in the first direction. At least a portion of the connection lines X may include first segments X1 disposed in the first display region AA1.

In the present disclosure, the first data lines D1 in each of the second display regions AA2 may be separated at the position of the notch K by the notch K. Each connection line X may connect two of the first data lines D1 in a same column and at two sides of the notch K respectively in the first direction, to guarantee a transmission of signals in the data lines. The non-display region BA may include a notch non-display region BAK semi-surrounding the notch K. The connection lines X may be disposed around the notch K. In conventional cases, the connections lines may cross the notch non-display region BAK. In the present disclosure, a portion of the connection lines X may include the first segments disposed in the first display region AA1. Correspondingly, a portion of the connection lines X may include both the segments in the notch non-display region BAK and the first segments in the first display regions AA1. Since a portion of the segments of the connection lines X may be disposed in the display region AA1, a space occupied by the connection lines in the notch non-display region may be reduced and the notch non-display region may be narrow.

In some other embodiments, all of the connection lines in the display panel may include the first segments. The space occupied by the connection lines in the notch non-display region may be reduced significantly.

Figure 2:
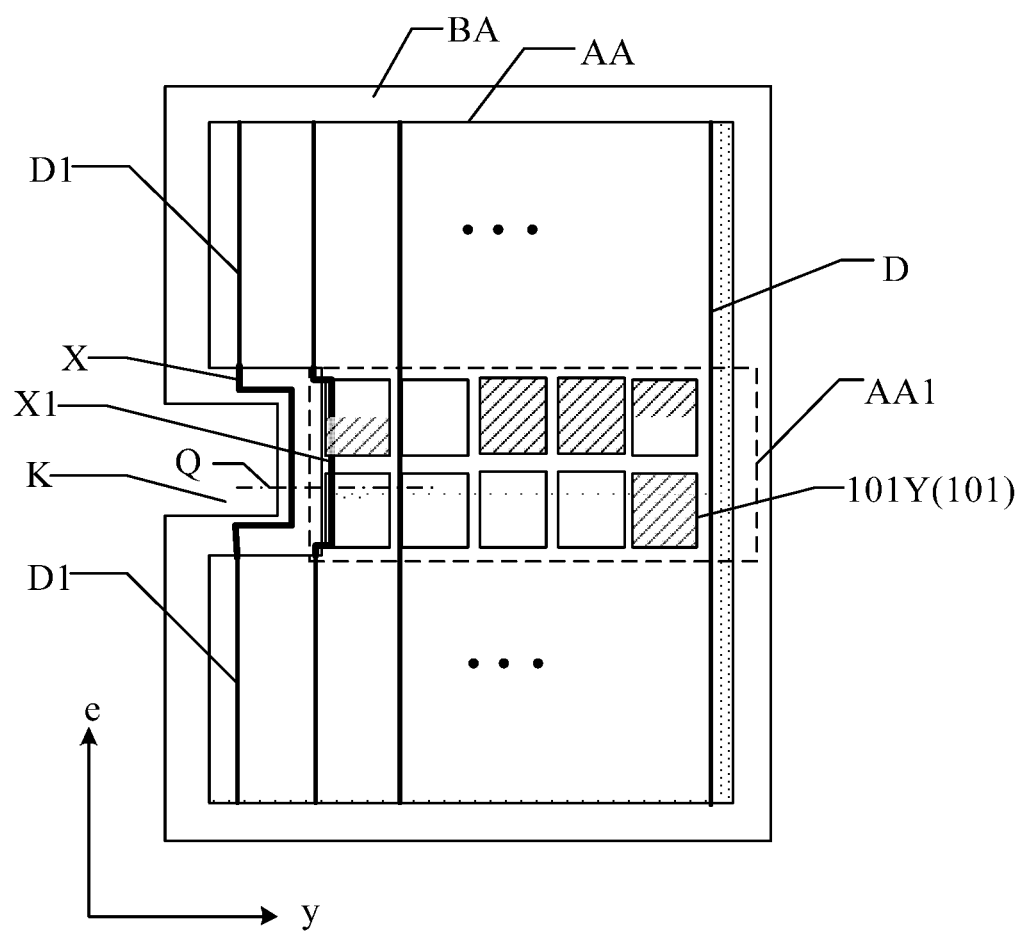
FIG. 2 illustrates another exemplary display panel consistent with various disclosed embodiments in the present disclosure.
Figure 3:
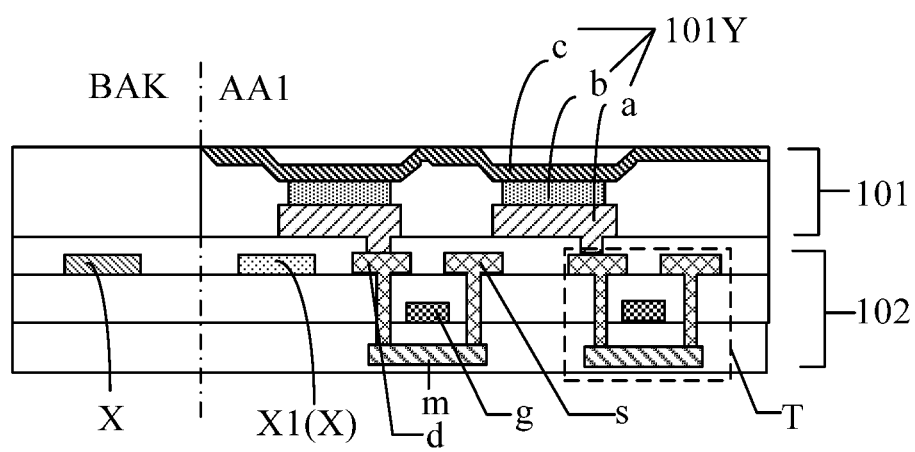
FIG. 3 illustrates a structure of film layers for the exemplary display panel in FIG. 2 at a position of a cross-section line Q.

FIG. 2 illustrates another exemplary display panel, and FIG. 3 illustrates a structure of film layers for the exemplary display panel at a position of a cross-section line Q in FIG. 2. In one embodiment illustrated in FIGS. 2-3, the display panel may further include a display layer 101. The display layer 101 may include a plurality of light-emitting units 101Y. In the first display region AA1, the first segments X1 may overlap insulately the plurality of light-emitting units 101Y. For description purposes only, FIGS. 2-3 only show a portion of the plurality of light-emitting units 101Y in the first display region AA1, and also an arrangement of the plurality of light-emitting units 101Y in FIGS. 2-3 is used to illustrate the present disclosure as an example only, and should not limit the scopes of the present disclosure.

As illustrated in FIG. 3, each of the plurality of light-emitting units 101Y may include an anode a, a light-emitting layer b, and a cathode c. The cathode c may be a transparent electrode, and the anode a may be a reflective electrode. Light emitted from the light-emitting layer b may escape from the cathode c. Each of the plurality of light-emitting units 101Y may be used as a pixel light-emitting region. The display panel may further include an array layer 102. The array layer 102 may be used to accommodate pixel circuits for driving the plurality of light-emitting units 101Y to emit light and different lines. The array layer 102 may include a plurality of transistors T. The connection lines X may be disposed in the array layer 102. In the present disclosure, the first segments X1 may be disposed in the first display region AA1, and the first segment X1 may overlap but be insulated from the plurality of light-emitting units 101Y. Since the first segments X and the plurality of light-emitting units 101Y may be disposed in separated film layers, the dispose of the first segments X may not affect an arrangement of the plurality of light-emitting units 101Y in the first display region AA1. Then a size of the pixel light-emitting regions in the first display region may not be affected and a change in a process for forming the display layer may be avoided.

As illustrated in FIG. 3, each of the plurality of transistors T may include a gate g, a source s, a drain d, and a source layer m. For description purposes only, the embodiment of the present disclosure shown in FIG. 3 where the connection lines X, the sources s and the drains d may be disposed in a same film layer is used as an example to illustrate the present disclosure, and should not limit the scopes of the present disclosure. In some other embodiments, the connection lines X may be disposed in one of other film layers in the array layer 102.

Figure 4:
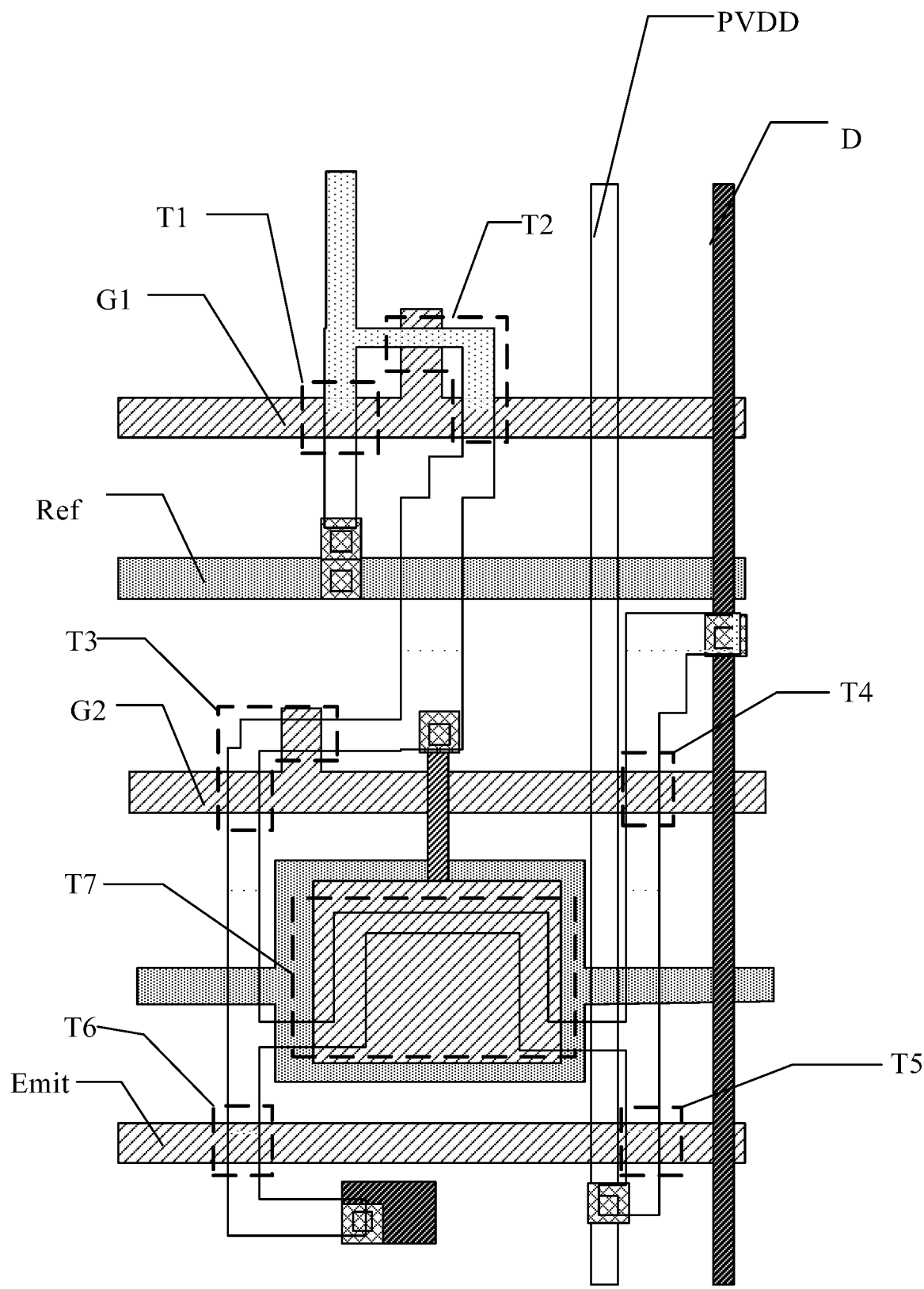
FIG. 4 illustrates a pixel circuit structure of an exemplary display panel consistent with various disclosed embodiments in the present disclosure.

In one embodiment, the display panel may further include a plurality of pixel circuits. The plurality of pixel circuits may be electrically connected to the plurality of light-emitting units in a one-to-one correspondence. FIG. 4 illustrates a structure of one of the plurality of pixel circuits in an exemplary display panel consistent with various disclosed embodiments in the present disclosure. In one embodiment illustrated in FIG. 4, each of the plurality of pixel circuits may include a first transistor T1, a second transistor T2, a third transistor T3, a fourth transistor T4, a fifth transistor T5, a sixth transistor T6, and a seventh transistor T7. The first transistor T1, the second transistor T2, the third transistor T3, the fourth transistor T4, the fifth transistor T5, and the sixth transistor T6 may be switch transistors. The seventh transistor T7 may be a driving transistor. The display panel may further include first scanning lines G1, second scanning lines G2, data lines D, anode power lines PVDD, reset lines Ref, and light-emitting control lines Emit. The embodiment with the pixel circuit illustrated in FIG. 4 is used as an example only to describe the present disclosure and should not limit the scopes of the present disclosure. As illustrated in FIGS. 3-4, to drive one of the plurality of light-emitting units 101Y to emit light, the one of the plurality of light-emitting units 101Y may be electrically connected to the seventh driving transistor T7 of a corresponding one of the plurality of pixel circuits P. The one of the plurality of pixel circuits usually is very complex and may include several transistors. In the process for forming the display panel, the transistors in the plurality of pixel circuits may be arranged to reduce a space occupied by the pixel circuits. Usually, the arrangement of the plurality of pixel circuits in the array layer of the display panel may be same as an arrangement of the plurality of light-emitting units in the display layer. The plurality of pixel circuits may include pixel circuits in the first display region and pixel circuits in the second display region. The plurality of light-emitting units may include light-emitting units in the first display region and light-emitting units in the second display region.

The first segments and the plurality of pixel circuits may be both disposed in the array layer. The arrangement of the plurality of pixel circuits, or an internal structure of each of the pixel circuits, may be designed to dispose the first segments in the first display region. The pixel circuits in the first display region will be described in detail in the below.

Figure 5:
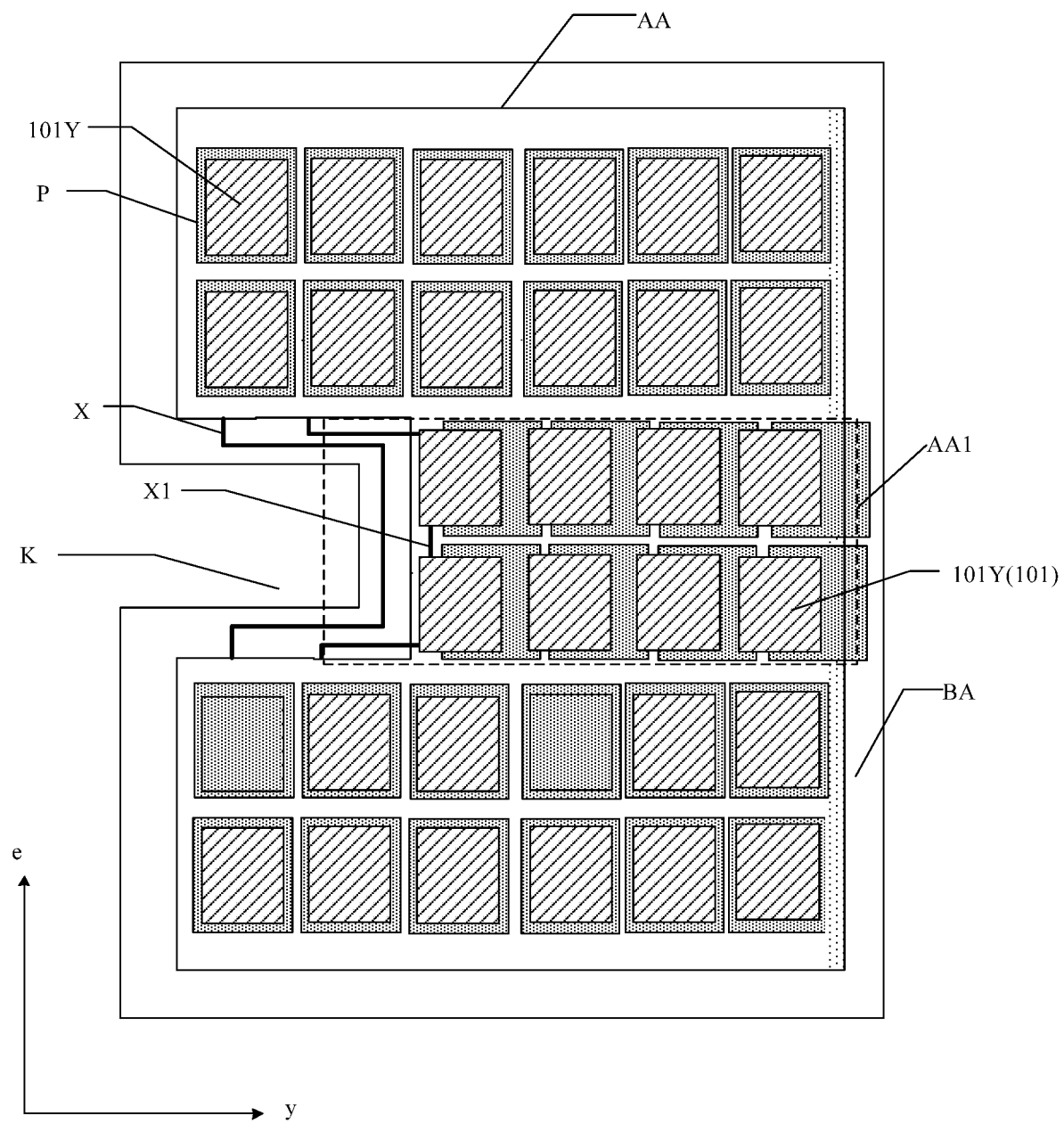
FIG. 5 illustrates another exemplary display panel consistent with various disclosed embodiments in the present disclosure.

In one embodiment, all of the pixel circuits in the first display region may be shifted corresponding to the light-emitting units 101Y in the first display region toward a side away from the notch K in the second direction. FIG. 5 illustrates another exemplary display panel consistent with various disclosed embodiments in the present disclosure. For description purposes only, FIG. 5 only shows a simplified schematic figure of the pixel circuit to illustrate a positional relationship between the pixel circuits and the plurality of light-emitting units. The data lines in the display region are not shown in FIG. 5. In one embodiment illustrated in FIG. 5, between the plurality of pixel circuits P and the plurality of light-emitting units 101Y in a one-to-one correspondence, each of the plurality of pixel circuits P and the corresponding one of the plurality of light-emitting units 101Y may have a relative position in a direction perpendicular to the display panel. All of the pixel circuits P in the first display region may be shifted with respect to the plurality of light-emitting units 101Y toward a side away from the notch K in the second direction. Correspondingly, a portion of the pixel circuits P in the first display region AA1 corresponding to a portion of the plurality of light-emitting units 101Y farthest from the notch K in the second direction y may be shifted into the non-display region. In a conventional display panel, light-emitting units and pixel circuits for driving the light-emitting units in the display region may have roughly same relative positions in the direction perpendicular to the display panel. In the present disclosure, at least a portion of the pixel circuits P in the first display region may be shifted corresponding to the plurality of light-emitting units 101Y toward a side away from the notch in the second direction. Correspondingly, a space may be preserved at a side of the first display region close to the notch, to accommodate the first segments. The first segments may be disposed in the first display region, and a space in the notch non-display region occupied by the first segments may be avoided. The notch non-display region may be narrow.

In one embodiment illustrated in FIG. 5, all of the pixel circuits P in the first display region may be shifted with respect to the plurality of light-emitting units 101Y toward a side away from the notch in the second direction. Correspondingly, a change in the internal structure of the pixel circuits may be avoided. In a process for forming the display panel, it may be only necessary to make pixel circuits in each entire row in the first display region shifted toward the side away from the notch.

Figure 6:
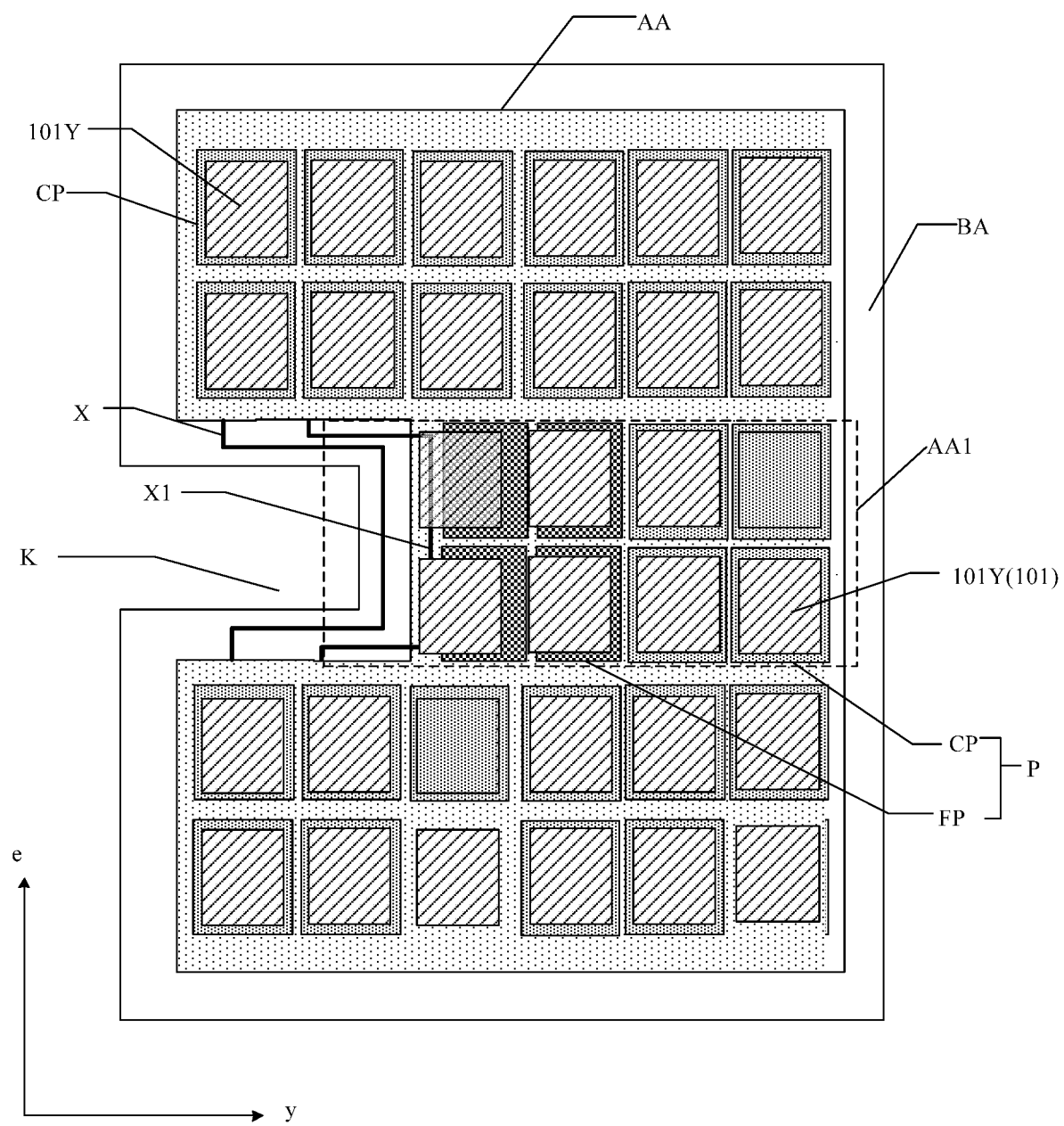
FIG. 6 illustrates another exemplary display panel consistent with various disclosed embodiments in the present disclosure.

In some other embodiments, only a portion of the pixel circuits P in the first display region may be shifted with respect to the plurality of light-emitting units 101Y toward the side away from the notch in the second direction. Since a space of the array layer is limited, the pixel circuits P in the first display region may be designed differently so that only a portion of the pixel circuits P in the first display region may be shifted with respect to the plurality of light-emitting units 101Y while a remaining portion of the pixel circuits P in the first display region may not be shifted. FIG. 6 illustrates another exemplary display panel consistent with various disclosed embodiments in the present disclosure. In one embodiment illustrated in FIG. 6, the pixel circuits P may include size-unadjusted pixel circuits CP and size-adjusted pixel circuits FP. In the second direction y, a length of the size-unadjusted pixel circuits CP may be larger than a length of the size-adjusted pixel circuits FP. A portion of the pixel circuits P in the first display region AA1 may be the size-adjusted pixel circuits FP. The length of the pixel circuits P is not shown in FIG. 6. Based on the disclosed embodiments, persons of ordinary skill in the art may derive other embodiments consistent with the present disclosure, all of which are within the scope of the present disclosure. All of the pixel circuits P outside the first display region AA1 may be the size-unadjusted pixel circuits CP. In the present disclosure, a portion of the pixel circuits P in the first display region AA1 may be the size-adjusted pixel circuits FP, and the length of the size-unadjusted pixel circuits CP may be larger than the length of the size-adjusted pixel circuits FP. By forming the size-adjusted pixel circuits, a space occupied by all of the pixel circuits P in the first display region as a whole in the second direction may be reduced, and a space occupied by the first segments may be preserved in the first display region. Correspondingly, a portion of the first segments may be disposed in the first display region, and a space occupied by the first segments in the notch non-display region may be avoided. The notch non-display region may be narrow.

In another embodiment, all of the pixel circuits P in the first display region may be shifted with respect to the plurality of light-emitting units 101Y toward a side away from the notch in the second direction, while the portion of the pixel circuits P corresponding to the portion of the plurality of light-emitting units 101Y farthest from the notch K in the second direction y may not be shift into the non-display region. At least a portion of the pixel circuits P in the first display region AA1 may be designed differently. At least a portion of the pixel circuits P in the first display region AA1 may be the size-adjusted pixel circuits FP, to preserve a space in the first display region for the first segments.

In various embodiments of the present disclosure, different methods may be adopted to make the length of the size-unadjusted pixel circuits CP larger than the length of the size-adjusted pixel circuits FP. For description purposes only, an embodiment with pixel circuits illustrated in FIG. 4 is used as an example to illustrate the present disclosure.

Figure 7:
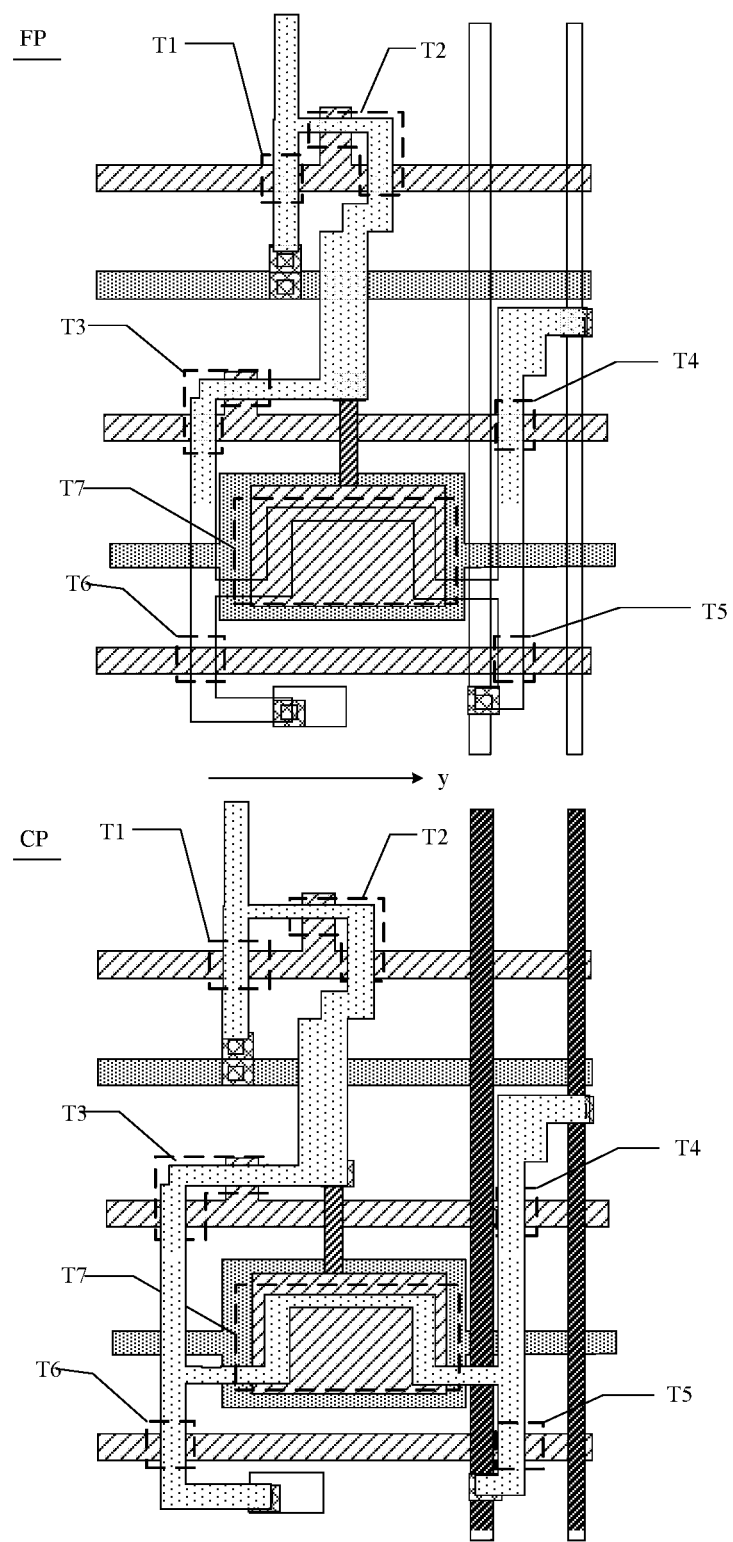
FIG. 7 illustrates a comparison between a size-unadjusted pixel circuit and a size-adjusted pixel circuit in another exemplary display panel consistent with various disclosed embodiments in the present disclosure.

FIG. 7 shows a comparison between a size-unadjusted pixel circuit and a size-adjusted pixel circuit in another exemplary display panel consistent with various disclosed embodiments in the present disclosure. In one embodiment illustrated in FIG. 7, each of the plurality of pixel circuits may include switch transistors. As illustrated in FIG. 4, in one of the plurality of pixel circuit, the first transistor T1, the second transistor T2, the third transistor T3, the fourth transistor T4, the fifth transistor T5, and the sixth transistor T6 may be switch transistors, while the seventh transistor T7 may be a driving transistor. FIG. 7 shows a size-unadjusted pixel circuit CP and a size-adjusted pixel circuit FP on the same scale. In the second direction y, a distance between the switch transistor T1 and the switch transistor T2 in the size-adjusted pixel circuit FP may be smaller than a distance between the switch transistor T1 and the switch transistor T2 in the size-unadjusted pixel circuit CP. A distance between the switch transistors T3/T6 and the driving transistor T7 in the size-adjusted pixel circuit FP may be smaller than a distance between the switch transistors T3/T6 and the driving transistor T7 in the size-unadjusted pixel circuit CP. In the present disclosure, a distance between a portion of lines in the plurality of pixel circuits may be adjusted to change a distance between the switch transistors. A distance between the switch transistors in the size-adjusted pixel circuit FP may be smaller than a distance between the switch transistor in the size-unadjusted pixel circuit CP. Correspondingly, a space occupied by the size-adjusted pixel circuits FP as a whole may be reduced to make the length of the size-unadjusted pixel circuits CP larger than the length of the size-adjusted pixel circuits FP.

Figure 8:
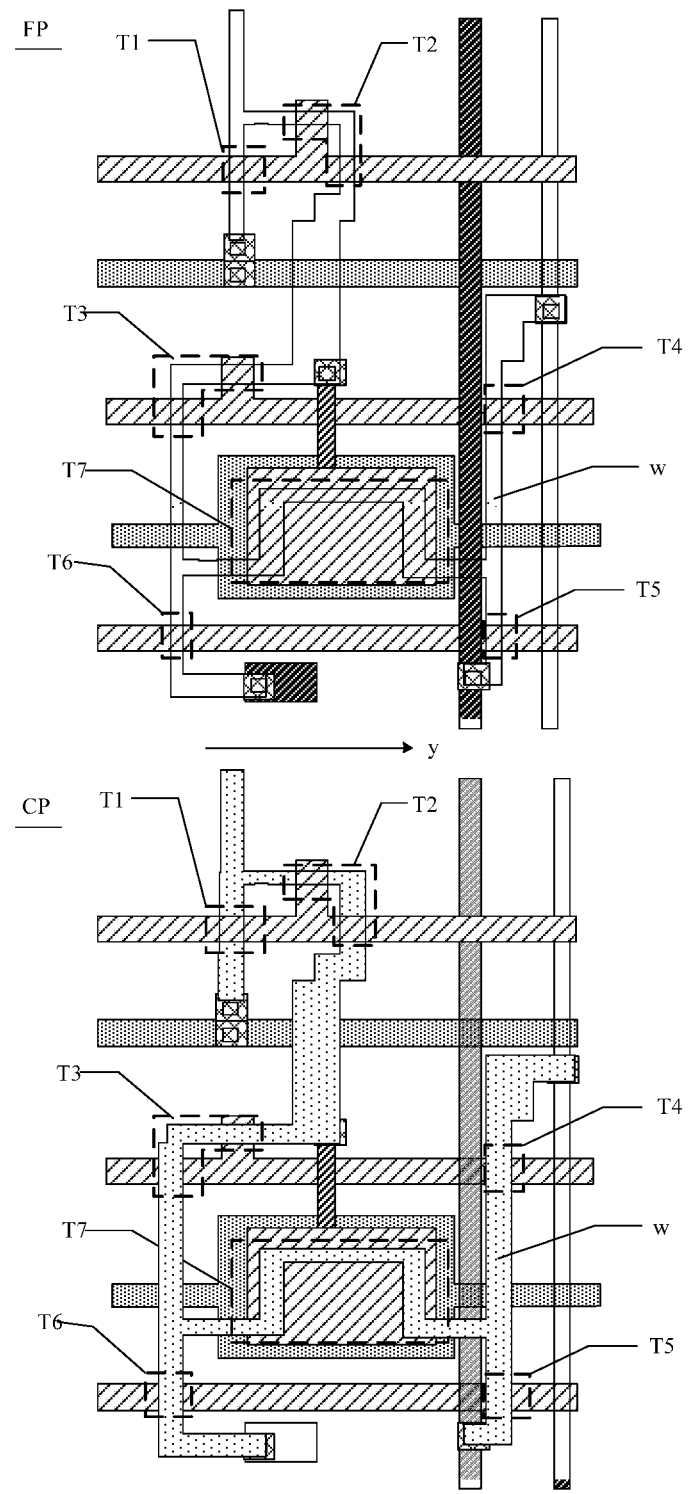
FIG. 8 illustrates another comparison between a size-unadjusted pixel circuit and a size-adjusted pixel circuit in another exemplary display panel consistent with various disclosed embodiments in the present disclosure.

FIG. 8 shows a comparison between a size-unadjusted pixel circuit and a size-adjusted pixel circuit in another exemplary display panel consistent with various disclosed embodiments in the present disclosure. In one embodiment illustrated in FIG. 8, each of the plurality of pixel circuits may include switch transistors. As illustrated in FIG. 4, in one of the plurality of pixel circuit, the first transistor T1, the second transistor T2, the third transistor T3, the fourth transistor T4, the fifth transistor T5, and the sixth transistor T6 may be switch transistors, while the seventh transistor T7 may be a driving transistor. A size of the switch transistors in the size-adjusted pixel circuits may be smaller than a size of the switch transistors in the size-unadjusted pixel circuits. FIG. 8 shows a size-unadjusted pixel circuit CP and a size-adjusted pixel circuit FP on a same scale. In a circuit structure of the product, a size of a switch transistor may be limited mainly by a size of a channel in the switch transistor. An overlap between the source layer and the gate in the switch transistor may form a channel. A size of the channel in each of the switch transistors T1 to T6 in the size-adjusted pixel circuit FP may be smaller than a size of the channel in the corresponding one of the switch transistors T1 to T6 in the size-unadjusted pixel circuit CP. A width of a portion of lines in the source layer w in the second direction y may be adjusted to decrease the size of the channel. A width of the size-adjusted pixel circuit FP in the second direction y may be reduced, and a length of the size-unadjusted pixel circuits CP larger than a length of the size-adjusted pixel circuits FP in the second direction y. In one pixel circuit, the switch transistors may control turning on or off of the circuit to control a flowing direction of currents. A light-emitting current I in one pixel circuit may be $I=k(V_{pvdd}-V_{data})^2$ where $V_{pvdd}$ is a voltage provided by the anode power line to the pixel circuit, $V_{data}$ is a voltage provided by the data line to the pixel circuit, and k is a parameter only determined by the driving transistor. In one embodiment, for example, in the switch transistor T6 of a size-adjusted pixel circuit illustrated in FIG. 6, a length of the channel may not change, but a width of the channel may be narrower to change a ratio between the length and the width of the channel. A change of parameters of the switch transistors may not affect the light-emitting current provided by the pixel circuits to the light-emitting units, and then may not affect the performance of a portion of the light-emitting units connected to the size-adjusted pixel circuits.

Figure 9:
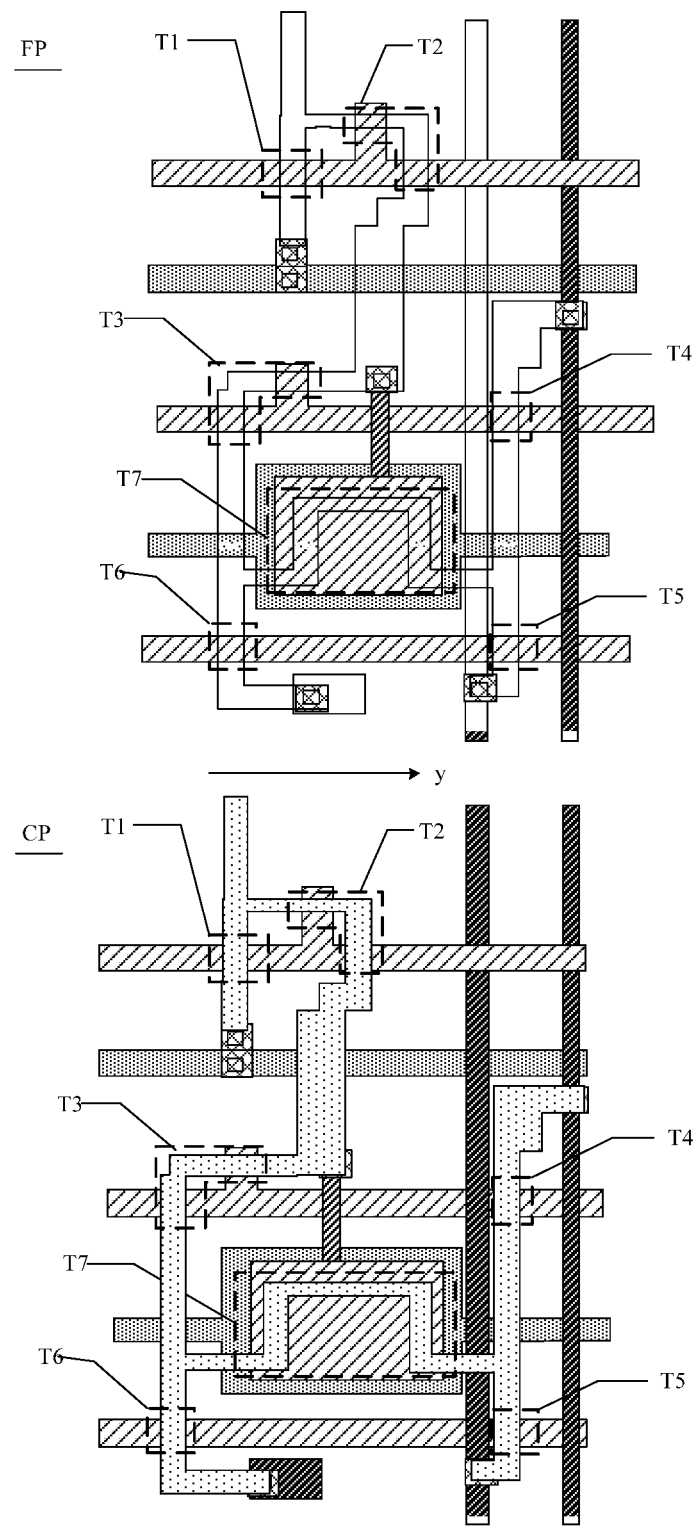
FIG. 9 illustrates another comparison between a size-unadjusted pixel circuit and a size-adjusted pixel circuit in another exemplary display panel consistent with various disclosed embodiments in the present disclosure.

FIG. 9 shows a comparison between a size-unadjusted pixel circuit and a size-adjusted pixel circuit in another exemplary display panel consistent with various disclosed embodiments in the present disclosure. In one embodiment illustrated in FIG. 9, each of the pixel circuits may further include a driving transistor. As illustrated in FIG. 4, in one pixel circuit, the first transistor T1, the second transistor T2, the third transistor T3, the fourth transistor T4, the fifth transistor T5, and the sixth transistor T6 may be switch transistors, while the seventh transistor T7 may be a driving transistor. A size of the driving transistors in the size-adjusted pixel circuits may be smaller than a size of the driving transistors in the size-unadjusted pixel circuits. FIG. 9 shows a size-unadjusted pixel circuit CP and a size-adjusted pixel circuit FP on a same scale. By making the size of the driving transistor T7 in the size-adjusted pixel circuit FP smaller than the size of the driving transistor T7 in the size-unadjusted pixel circuit CP, a width of the size-adjusted pixel circuit FP in the second direction y may be significantly reduced. In some embodiments, when reducing the size of the driving transistor in the size-adjusted pixel circuit, a ratio between the width of the channel and the length of the channel in the driving transistor may be kept constant. For example, a ratio between the width of the channel and the length of the channel in the driving transistor may change from 3:18 to 2.5:15. By making the size of the driving transistor T7 in the size-adjusted pixel circuit FP smaller than the size of the driving transistor T7 in the size-unadjusted pixel circuit CP but making the ratio between the width of the channel and the length of the channel in the driving transistor of the size-adjusted pixel circuit FP equal to the ratio between the width of the channel and the length of the channel in the driving transistor of the size-unadjusted pixel circuit CP, a change of the design for the driving transistor of the size-adjusted pixel circuit FP may have no influence on the light-emitting currents.

Figure 10:
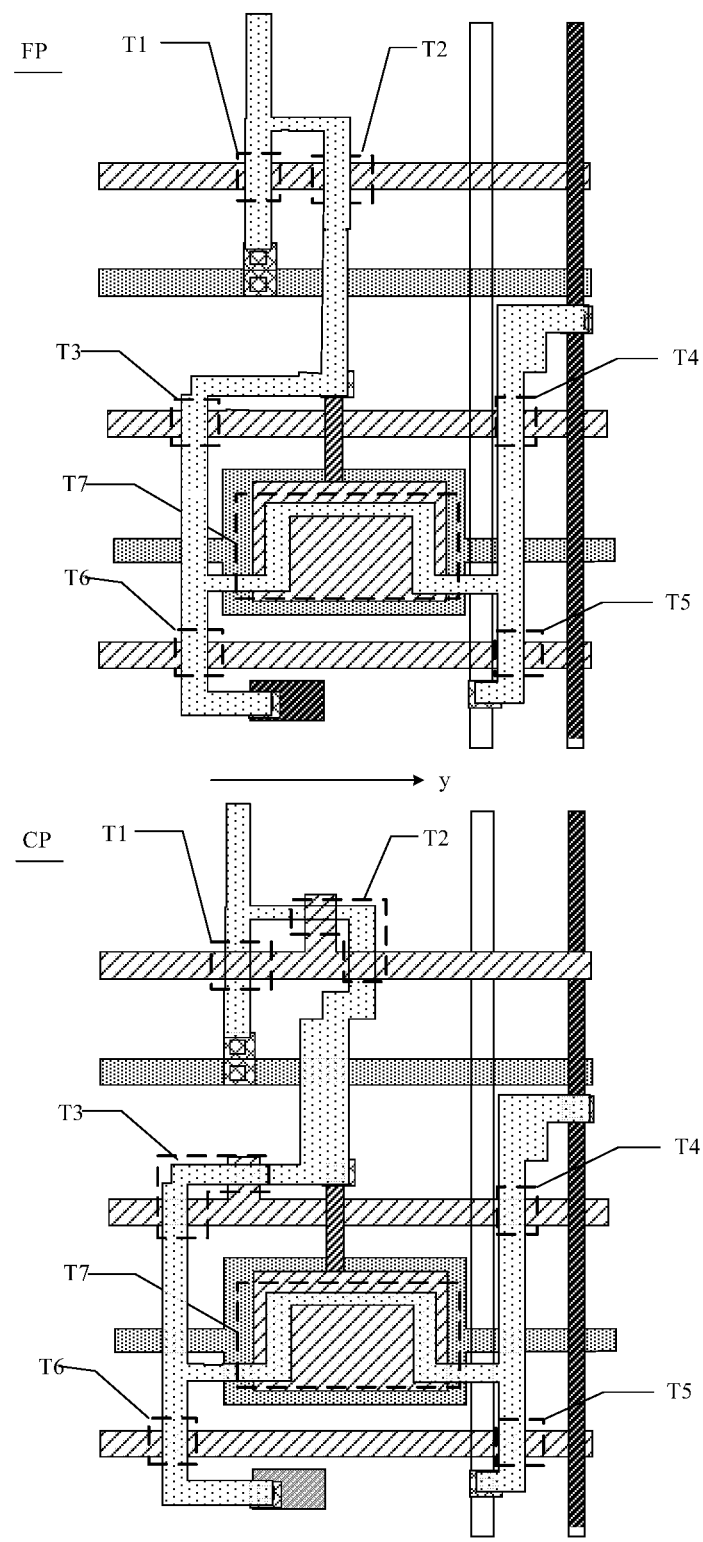
FIG. 10 illustrates another comparison between a size-unadjusted pixel circuit and a size-adjusted pixel circuit in another exemplary display panel consistent with various disclosed embodiments in the present disclosure.

In one embodiment, the plurality of pixel circuits may include switch transistors. The switch transistors may include compensation transistors and initialization transistors. In the size-adjusted pixel circuit, at least one of the compensation transistors and the initialization transistors may be single-gate transistors. In the size-unadjusted pixel circuit, the compensation transistors and the initialization transistors may be dual-gate transistors. Correspondingly, a size of the size-adjusted pixel circuit in the second direction may be reduced to make a length of the size-adjusted pixel circuits FP smaller than a length of the size-unadjusted pixel circuits CP. FIG. 10 shows a comparison between a size-unadjusted pixel circuit and a size-adjusted pixel circuit in another exemplary display panel consistent with various disclosed embodiments in the present disclosure. In one embodiment illustrated in FIG. 10 and FIG. 4, in one pixel circuit, the second transistor T2 may be an initialization transistor and the third transistor T3 may be a compensation transistor. In the size-adjusted pixel circuit, the initialization transistor T2 and the compensation transistor T3 may both be single-gate transistors. In the size-unadjusted pixel circuit, the initialization transistor T2 and the compensation transistor T3 may both be dual-gate transistors. For description purposed only, the embodiment in FIG. 10 where the initialization transistor T2 and the compensation transistor T3 in the size-adjusted pixel circuit may both be single-gate transistors while the initialization transistor T2 and the compensation transistor T3 in the size-unadjusted pixel circuit may both be dual-gate transistors is used as an example to illustrate the present disclosure, and should not limit the scopes of the present disclosure.

FIGS. 7-10 provide fourth methods to configure the size-adjusted pixel circuits. Either one or any suitable combination of these four methods may be used in a display panel.

Figure 11:
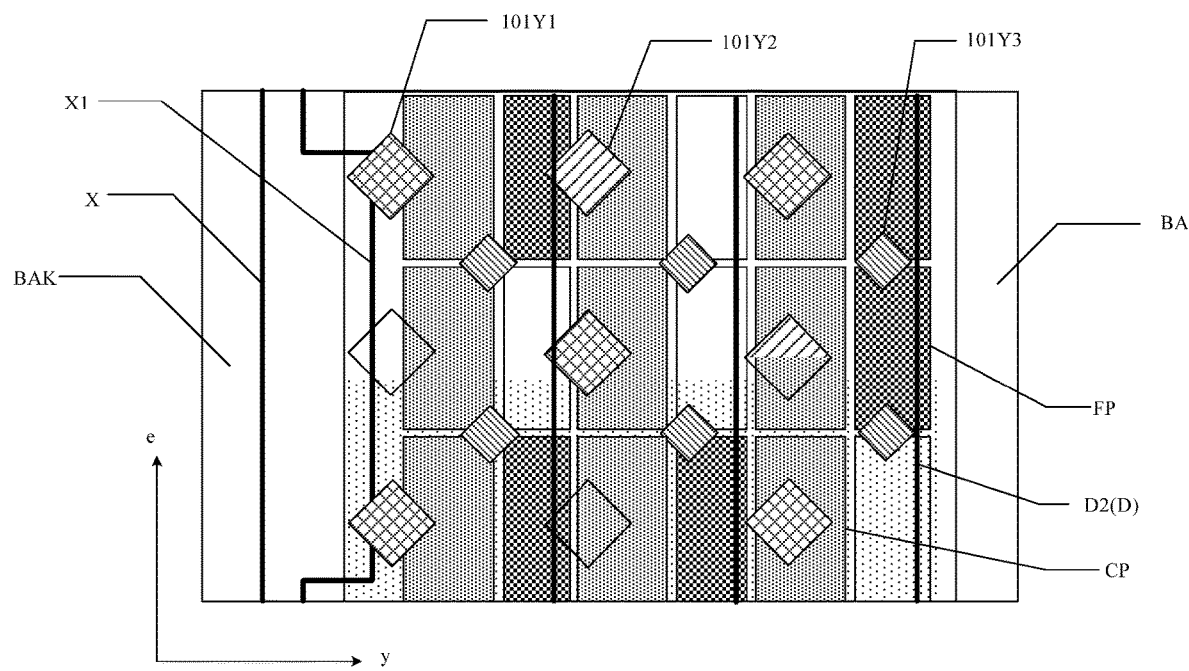
FIG. 11 illustrates another exemplary display panel consistent with various disclosed embodiments in the present disclosure.

In one embodiment, the data lines may further include second data lines. A plurality of light-emitting units driven by the second data lines may emit light with a same color. FIG. 11 shows another exemplary display panel consistent with various disclosed embodiments in the present disclosure. For description purposes only, the embodiment in FIG. 11 showing an arrangement of the plurality of light-emitting units where only a local part of the plurality of light-emitting units in the first display region AA1 is shown is used as an example to illustrate the present disclosure, and should not limit the scopes of the present disclosure. In one embodiment, the plurality of light-emitting units 101Y may at least include first light-emitting units 101Y1, second light-emitting unit 101Y2, and third light-emitting unit 101Y3. The data lines D may include second data lines D2. The plurality of light-emitting units driven by the second data lines D2 may emit light with a same color. In one embodiment illustrated in FIG. 11, the second data lines D2 may drive the third light-emitting units 101Y3. The first light-emitting units 101Y1 and the second light-emitting unit 101Y2 may be disposed alternately. The first light-emitting units 101Y1 and the second light-emitting unit 101Y2 in a same column may be driven by a same data line. In the first display region, the pixel circuits P electrically connected to the third light-emitting units 101Y3 which are driven by the second data lines D2 may be the size-adjusted pixel circuits FP.

Figure 12:
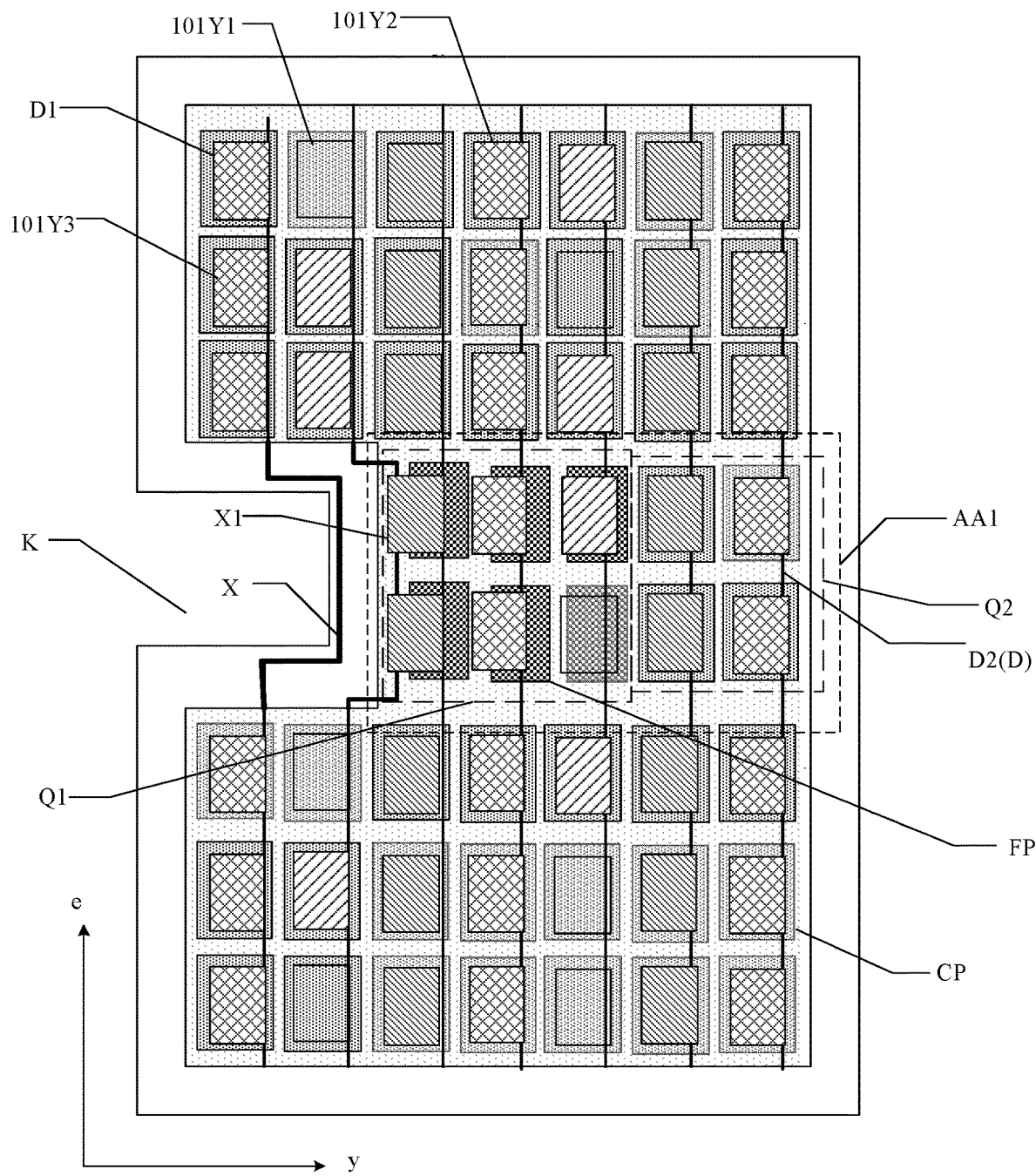
FIG. 12 illustrates another exemplary display panel consistent with various disclosed embodiments in the present disclosure.

FIG. 12 shows another exemplary display panel consistent with various disclosed embodiments in the present disclosure. In one embodiment illustrated in FIG. 12, the plurality of light-emitting units 101Y may at least include first light-emitting units 101Y1, second light-emitting unit 101Y2, and third light-emitting unit 101Y3. Two first data lines D1 at two sides of the notch K respectively and in a same column may be connected to each other by the corresponding one of the connection lines X. At least a portion of the connection lines X may include the first segments X1. The first segments X1 may be disposed in the first display region AA1. In the embodiment of the present disclosure, the light-emitting units in a same column may be driven by one of the second data lines D2 and may emit light with a same color. In the first display region AA1, the pixel circuits connected to a portion of the light-emitting units driven by the second data lines D2 may be the size-adjusted pixel circuits FP. In some other embodiments, in the first display region AA1, the pixel circuits connected to all the light-emitting units driven by the second data lines D2 may be the size-adjusted pixel circuits FP. The circuit structure of the size-adjusted pixel circuits for the display panel in FIGS. 11-12 may be referred to FIGS. 7-10 and the corresponding description.

In the embodiments illustrated in FIGS. 11-12, the light-emitting units driven by the second data lines may emit light with a same color, and the pixel circuits connected to all the light-emitting units driven by the second data lines in the first display region may be the size-adjusted pixel circuits. A space in the first display region occupied by the pixel circuits as a whole may be reduced by configuring the pixel circuits in one or more columns in the first display region as the unconditional pixel circuits. A design for adjusting the pixel circuits in one or more whole columns may be simple in the process for forming the display panel. Since the light-emitting units driven by a same second data line may emit light with a same color and the structure of the pixel circuits connected to the light-emitting units emitting light with a same color may be adjusted. Correspondingly, even the adjustment of the structure of the pixel circuits may affect the light-emitting currents of the light-emitting units, only light-emitting performance of the light-emitting units with a same color may be affected. When these light-emitting units emit light mixed with the light-emitting units with other colors, the adjustment of the structure of the pixel circuits may affect light mixing in a consistent way and may not affect the display performance of the display panel.

In one embodiment, the plurality of light-emitting units may at least include red light-emitting units, green light-emitting units, and blue light-emitting units. In the first display region, at least a portion of the light-emitting units for at least one color may be connected to the size-adjusted pixel circuits. In one embodiment, in the first display region, a portion of the light-emitting units for each of the three colors may be connected to the size-adjusted pixel circuits. In some other embodiments, in the first display region, a portion of the light-emitting units for only one color or for two colors may be connected to the size-adjusted pixel circuits. In some other embodiments, all the light-emitting units for all of the three colors may be connected to the size-adjusted pixel circuits. The circuit structure of the size-adjusted pixel circuits for the display panel may be referred to FIGS. 7-10 and the corresponding description.

Figure 13:
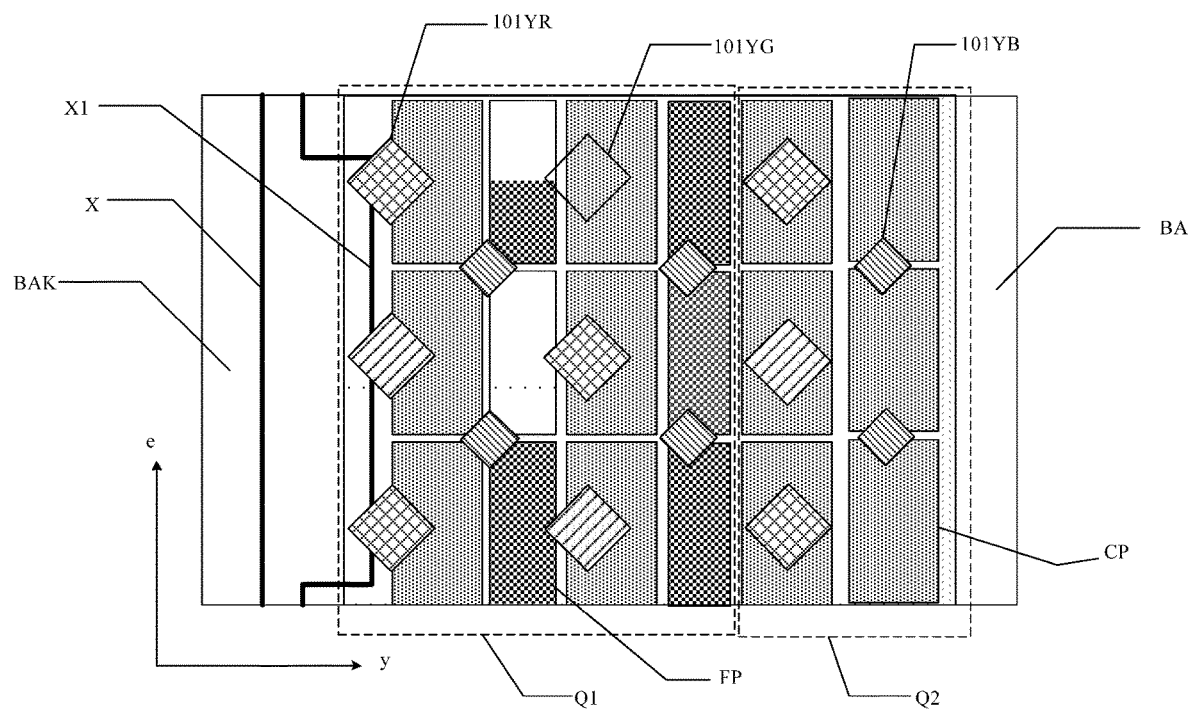
FIG. 13 illustrates another exemplary display panel consistent with various disclosed embodiments in the present disclosure.

In one embodiment, in the first display region, a portion of the blue light-emitting units may be connected to the size-adjusted pixel circuits. FIG. 13 shows another exemplary display panel consistent with various disclosed embodiments in the present disclosure. In one embodiment illustrated in FIG. 13 showing an optional arrangement of the light-emitting units, the plurality of light-emitting units 101Y may at least include red light-emitting units 101YR, green light-emitting units 101YG, and blue light-emitting units 101YB. In the first display region AA1, a portion of the blue light-emitting units 101YB may be connected to the size-adjusted pixel circuits FR. In the present disclosure, a difference between the length of the size-adjusted pixel circuits and the length of the size-unadjusted pixel circuits in the second direction may be adjusted by adjusting a size of the switch transistors, a size of the driving transistors, a distance between the switch transistors, in the pixel circuits. The above adjustment may induce a difference between the light-emitting currents provided to the corresponding light-emitting units by the size-adjusted pixel circuits and by the size-unadjusted pixel circuits. By connecting a portion of the blue light-emitting units to the size-adjusted pixel circuits and making the size of the driving transistors in the size-adjusted pixel circuits smaller than the size of the driving transistors in the size-unadjusted pixel circuits, the light-emitting currents provided to the corresponding light-emitting units by the size-adjusted pixel circuits may increase. Since the light-emitting materials in different color light-emitting units may have different light-emitting performance and the light-emitting material in the blue light-emitting units may have a lowest light-emitting efficiency, the light-emitting efficiency of the blue light-emitting units may be improved by connecting the blue light-emitting units to the size-adjusted pixel circuits with larger light-emitting currents in the present disclosure.

Figure 14:
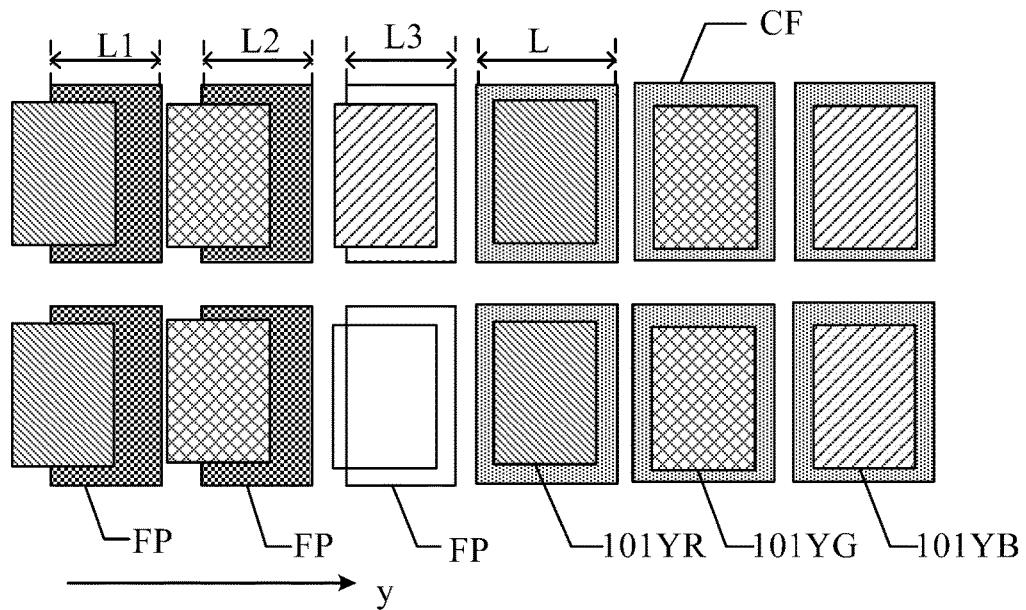
FIG. 14 illustrates another exemplary display panel consistent with various disclosed embodiments in the present disclosure.

FIG. 14 shows another exemplary display panel consistent with various disclosed embodiments in the present disclosure. In one embodiment illustrated in FIG. 14 only showing an optional arrangement of the light-emitting units in the first display region AA1, the size-unadjusted pixel circuits CP may have a length L in the second direction. In the first display region, the size-adjusted pixel circuits FP connected to the red light-emitting units 101YR may have a length L1 in the second direction, the size-adjusted pixel circuits FP connected to the green light-emitting units 101YG may have a length L2 in the second direction, and the size-adjusted pixel circuits FP connected to the blue light-emitting units 101YB may have a length L3 in the second direction. All of L1, L2, and L3 may be smaller than L. In some embodiments, a portion of the light-emitting units for each of the three colors may be connected to the size-adjusted pixel circuits, and L1, L2, and L3 may be same or different. The length of each size-adjusted pixel circuit may be designed flexibly according to the light-emitting properties of the light-emitting units for different colors and/or process parameters.

In one embodiment, the length of each size-adjusted pixel circuit may be set as L1<L2<L3. The light-emitting properties of the light-emitting units for different colors may be different, so the light-emitting units for different colors may need different light-emitting currents provided the corresponding size-adjusted pixel circuits. In one embodiment, the size-adjusted pixel circuits with L1<L2<L3 may be achieved by adjusting the size of the driving transistor in each size-adjusted pixel circuit. A length of the channels in the driving transistors of the size-adjusted pixel circuits connected to the blue light-emitting units may be smaller than a length of the channels in the driving transistors of the size-adjusted pixel circuits connected to the green light-emitting units, and the length of the channels in the driving transistors of the size-adjusted pixel circuits connected to the green light-emitting units may be smaller than a length of the channels in the driving transistors of the size-adjusted pixel circuits connected to the red light-emitting units. Correspondingly, the driving transistors in all the size-adjusted pixel circuits connected to the light-emitting units for all three colors may work in the saturation region. Correspondingly, the size-adjusted pixel circuits may provide light-emitting current to the blue light-emitting units larger than the light-emitting currents provided by the size-adjusted pixel circuits to the green light-emitting units, and the size-adjusted pixel circuits may provide the light-emitting current to the green light-emitting units larger than the light-emitting currents provided by the size-adjusted pixel circuits to the red light-emitting units. Different requirements on the light-emitting currents of the light-emitting units for different colors provided by the pixel circuits may be satisfied and light-emitting efficiency of the light-emitting units for different colors may be improved.

In some embodiments, the first display region may include a first region and a second region. In the second direction, the notch, the first region, and the second region may be disposed sequentially. For the pixel circuits in the first display region, a least a portion of the pixel circuits in the first region may be the size-adjusted pixel circuits, and all of pixel circuits in the second region may be the size-unadjusted pixel circuits. Correspondingly, a change of the pixel circuits in the second region may be avoided, and only a portion of the pixel circuits in the first region may be changed. This can be easily achieved by adjusting masks in the process for forming the display panel.

As illustrated in FIG. 12, in one embodiment, the first display region AA1 may include a first region Q1 and a second region Q2. For the pixel circuits in the first display region, all of pixel circuits in the first region Q1 may be the size-adjusted pixel circuits and all of pixel circuits in the second region Q2 may be the size-unadjusted pixel circuits.

As illustrated in FIG. 13, in another embodiment, the first display region AA1 may include a first region Q1 and a second region Q2. For the pixel circuits in the first display region, a portion of pixel circuits in the first region Q1 may be the size-adjusted pixel circuits and all of pixel circuits in the second region Q2 may be the size-unadjusted pixel circuits.

Figure 15:
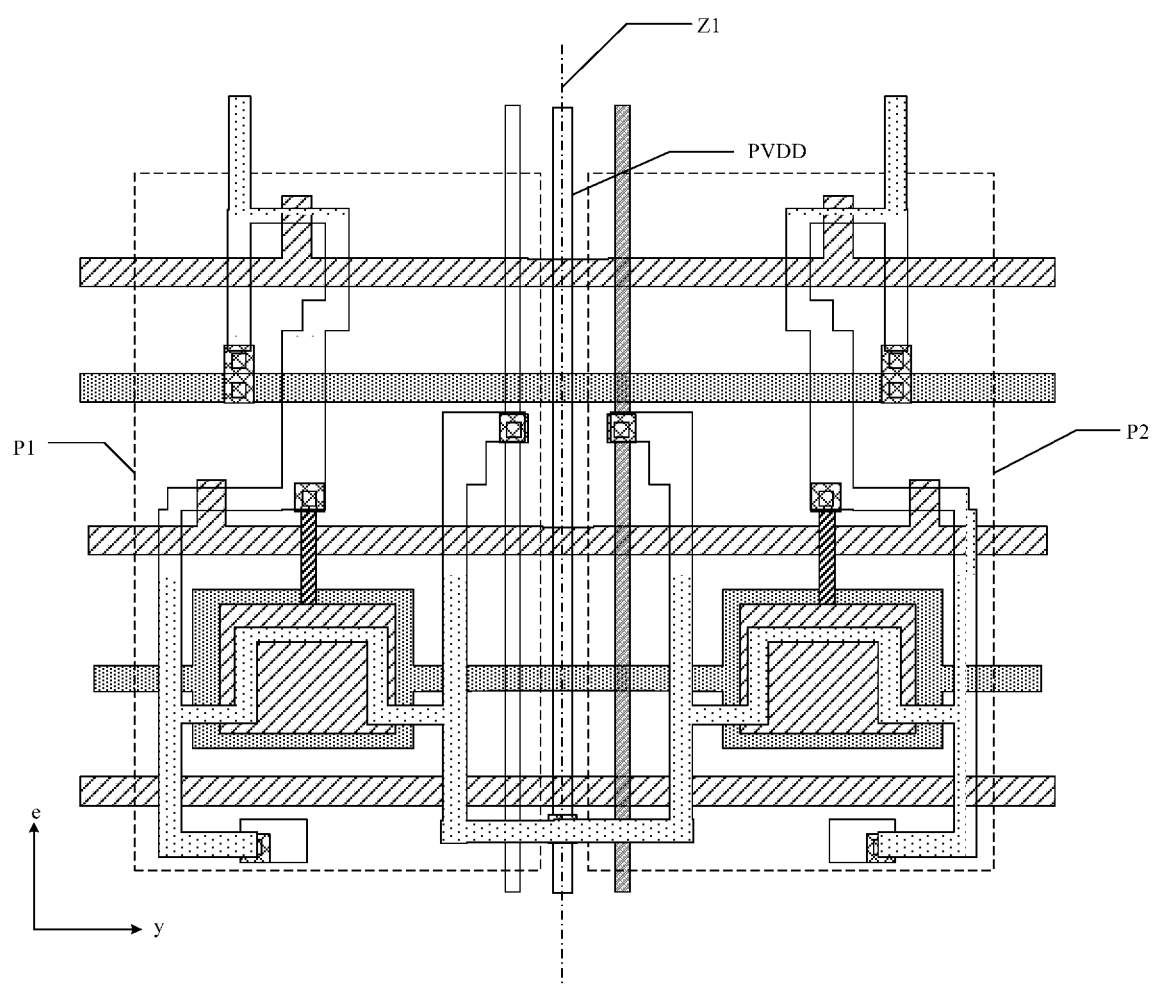
FIG. 15 illustrates another exemplary display panel consistent with various disclosed embodiments in the present disclosure.

In some embodiments, in the first display region, each of the light-emitting units may include a first light-emitting unit and second light-emitting unit adjacent to the first light-emitting unit in the second direction. A corresponding one of the pixel circuits in the first display region may include a first pixel circuit electrically connected to the first light-emitting unit and a second pixel circuit electrically connected to the second light-emitting unit. The first light-emitting unit and the second pixel circuits may be symmetric to each other about a symmetry axis extending in the first direction. The display panel may further include power lines extending in the first direction. The pixel circuits may include the driving transistors. The power lines may be electrically connected to the driving transistors to produce driving currents. In one light-emitting unit, the driving transistor of the first pixel circuit and the driving transistor of the second pixel circuit may be connected to one same power line. FIG. 15 shows another exemplary display panel consistent with various disclosed embodiments in the present disclosure. In one embodiment illustrated in FIG. 15 showing a first pixel circuit P1 and a second pixel circuit P2 symmetric to each other in one light-emitting unit in the first display region AA1. In one light-emitting unit, the first pixel circuit P1 and the second pixel circuit P2 may be symmetric to each other about a first symmetry axis Z1 extending in the first direction e. The driving transistor of the first pixel circuit P1 and the driving transistor of the second pixel circuit P2 may be connected to one same power line PVDD. In this embodiment of the present disclosure, the first pixel circuit and the second pixel circuit may be connected to one same power line. A quantity of the power lines in the first display region may be reduced correspondingly since the power lines extending in the first direction may occupy spaces in the second direction. Then a space occupied by all the power lines in the second direction may be reduced and the space for the first segments in the first display region may be preserved.

The present disclosure also provides a display device. The display device may include any display panel provided by various embodiments of the present disclosure.

Figure 16:
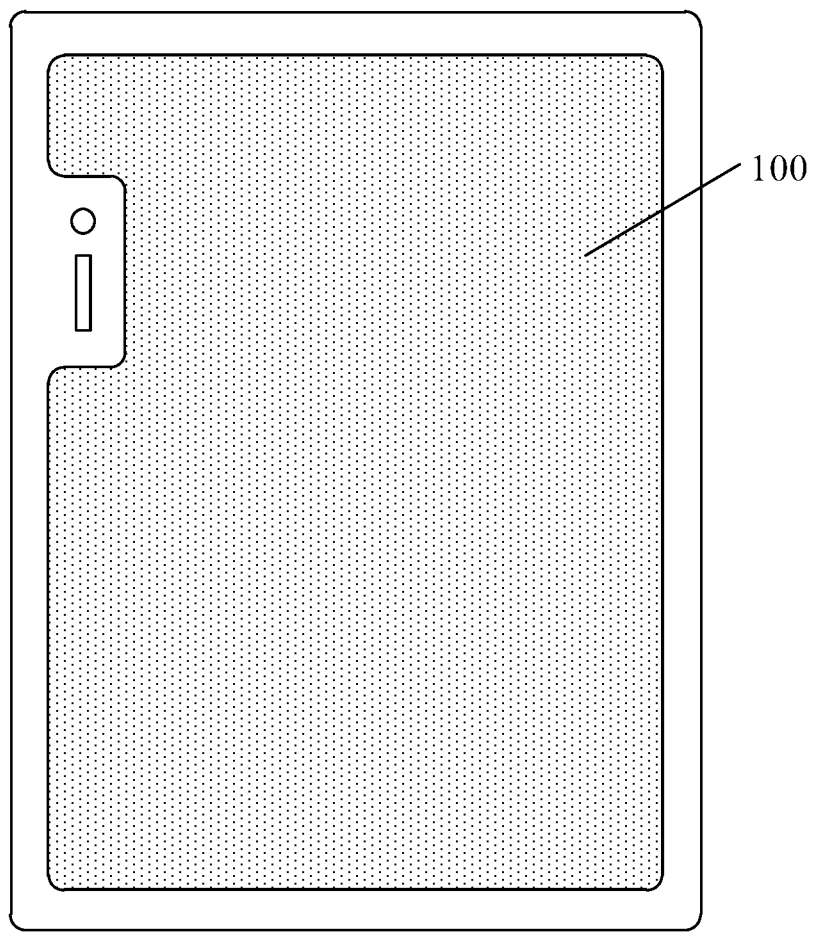
FIG. 16 illustrates an exemplary display device consistent with various disclosed embodiments in the present disclosure.

In one embodiment illustrated in FIG. 16, the display device may include a display panel 100 provided by various embodiments of the present disclosure.

In the display panel and display device provided by various embodiments of the present disclosure, a portion of the connection lines may include the first segments in the first display region. Correspondingly, a portion of the connection lines may include wires in the notch non-display region and the first segments in the first display region. By disposing a portion of the segments of the connection lines in the display region, a space occupied by the connection lines in the notch non-display region may be reduced and a narrow notch non-display region may be achieved.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A display panel, comprising:
a display region;
a non-display region surrounding the display region; and
at least one notch;
wherein:
a plurality of data lines is disposed in the display region and extends along a first direction;
an edge of the display panel recesses in a second direction toward an inside of the display region to form the at least one notch, the second direction intersecting the first direction;
the display region includes a first display region and second display regions, the second display regions including a first second-display region and a second second-display region;
the at least one notch and the first display region are disposed between the first and second second-display regions in the first direction;
the at least one notch and the first display region are adjacent to each other in the second direction;
the plurality of data lines includes first data lines in each second display region separated by the at least one notch;
along the first direction, connection lines are disposed surrounding the at least one notch, and each connection line connects two of the first data lines in a same column and on two sides of the at least one notch; and
at least a portion of the connection lines includes a first segment disposed in the first display region.

2. The display panel according to claim 1, further including a display layer, wherein:
the display layer includes a plurality of light-emitting units in the display region; and
in the first display region, the first segment and the plurality of light-emitting units overlap and are insulated from each other.

3. The display panel according to claim 2, further including a plurality of pixel circuits, wherein:
the plurality of pixel circuits is electrically connected to the plurality of light-emitting units in a one-to-one correspondence;
each of the plurality of pixel circuits and a corresponding one of the plurality of light-emitting units have a relative position in a direction perpendicular to the display panel;
the plurality of pixel circuits includes pixel circuits in the first display region and pixel circuits in the second display region; and
at least a portion of the pixel circuits in the first display region is shifted toward a side away from the at least one notch in the second direction with respect to the plurality of light-emitting units.

4. The display panel according to claim 3, wherein:
the plurality of pixel circuits includes size-unadjusted pixel circuits and size-adjusted pixel circuits;
in the second direction, a length of the size-unadjusted pixel circuits is larger than a length of the size-adjusted pixel circuits; and
at least a portion of the pixel circuits in the first display region includes the size-adjusted pixel circuits.

5. The display panel according to claim 4, wherein:
the plurality of pixel circuits includes switch transistors; and
a distance between the switch transistors in a size-adjusted pixel circuit is smaller than a distance between the switch transistors in a size-unadjusted pixel circuit.

6. The display panel according to claim 4, wherein:
the plurality of pixel circuits includes switch transistors; and
a size of the switch transistors in a size-adjusted pixel circuit is smaller than a size of the switch transistors in a size-unadjusted pixel circuit.

7. The display panel according to claim 4, wherein:
the plurality of pixel circuits further includes driving transistors; and
a size of the driving transistors in a size-adjusted pixel circuit is smaller than a size of the driving transistors in a size-unadjusted pixel circuit.

8. The display panel according to claim 4, wherein:
the plurality of pixel circuits includes switch transistors;
the switch transistors include compensation transistors and initialization transistors;
in the size-adjusted pixel circuits, at least one type among the compensation transistors and the initialization transistors are single-gate transistors; and
in the size-unadjusted pixel circuits, the compensation transistors and the initialization transistors are dual-gate transistors.

9. The display panel according to claim 4, wherein:
the plurality of data lines includes second data lines;

a portion of the plurality of light-emitting units driven by one second data line emits light with a same color; and a portion of the pixel circuits in the first display region electrically connected to a portion of the plurality of light-emitting units driven by the second data lines are the size-adjusted pixel circuits.

10. The display panel according to claim 4, wherein:

the plurality of light-emitting units includes red light-emitting units, green light-emitting units, and blue light-emitting units; and in the first display region, at least a portion of the plurality of light-emitting units for at least one color is electrically connected to the size-adjusted pixel circuits.

11. The display panel according to claim 10, wherein at least a portion of the blue light-emitting units in the first display region is electrically connected to the size-adjusted pixel circuits.

12. The display panel according to claim 10, wherein:

the length of the size-unadjusted pixel circuits in the second direction is L;

in the first display region, a length of a portion of the size-adjusted pixel circuits electrically connected to the red light-emitting units in the second direction is L1, a length of a portion of the size-adjusted pixel circuits electrically connected to the green light-emitting units in the second direction is L2, and a length of a portion of the size-adjusted pixel circuits electrically connected to the blue light-emitting units in the second direction is L3; and L1<L, L2<L, and L3<L.

13. The display panel according to claim 12, wherein: L1<L2<L3.

14. The display panel according to claim 4, wherein:

the first display region includes a first region and a second region;

in the second direction, the at least one notch, the first region, and the second region are disposed sequentially;

at least a portion of pixel circuits in the first region includes the size-adjusted pixel circuits; and pixel circuits in the second region include the size-unadjusted pixel circuits.

15. The display panel according to claim 3, wherein:

in the first display region, each of the plurality of light-emitting units includes a first light-emitting unit and a second light-emitting unit adjacent to each other in the second direction;

a pixel circuit corresponding to one of the plurality of light-emitting units includes a first pixel circuit electrically connected to the first light-emitting unit and a second pixel circuit electrically connected to the second light-emitting unit;

the first pixel circuit and the second pixel circuit are symmetric to each other about a symmetry axis extending in the first direction;

the display panel further includes power lines extending in the first direction;

the pixel circuits include driving transistors;

the power lines are electrically connected to the driving transistors for providing driving currents; and in a pixel circuit for one of the plurality of light-emitting units, the driving transistor of the first pixel circuit and the driving transistor of the second pixel circuit are electrically connected to one same power line.

16. A display device, comprising a display panel, wherein, the display panel includes:

a display region;

a non-display region surrounding the display region; and at least one notch;

wherein, a plurality of data lines is disposed in the display region and extends along a first direction;

an edge of the display panel recesses in a second direction toward an inside of the display region to form the at least one notch, the second direction intersecting the first direction;

the display region includes a first display region and second display regions, the second display regions including a first second-display region and a second second-display region;

the at least one notch and the first display region are disposed between the first and second second-display regions in the first direction;

the at least one notch and the first display region are adjacent to each other in the second direction;

the plurality of data lines includes first data lines in each second display region separated by the at least one notch;

along the first direction, connection lines are disposed surrounding the at least one notch, and each connection line connects two of the first data lines in a same column and on two sides of the at least one notch; and at least a portion of the connection lines includes a first segment disposed in the first display region.

17. The display device according to claim 16, further including a display layer, wherein:

the display layer includes a plurality of light-emitting units in the display region; and in the first display region, the first segment and the plurality of light-emitting units overlap and are insulated from each other.

18. The display device according to claim 17, further including a plurality of pixel circuits, wherein:

the plurality of pixel circuits is electrically connected to the plurality of light-emitting units in a one-to-one correspondence;

each of the plurality of pixel circuits and a corresponding one of the plurality of light-emitting units have a relative position in a direction perpendicular to the display panel;

the plurality of pixel circuits includes pixel circuits in the first display region and pixel circuits in the second display region; and at least a portion of the pixel circuits in the first display region is shifted toward a side away from the at least one notch in the second direction with respect to the plurality of light-emitting units.

19. The display device according to claim 18, wherein:

the plurality of pixel circuits includes size-unadjusted pixel circuits and size-adjusted pixel circuits;

in the second direction, a length of the size-unadjusted pixel circuits is larger than a length of the size-adjusted pixel circuits; and at least a portion of the pixel circuits in the first display region includes the size-adjusted pixel circuits.

20. The display device according to claim 18, wherein:

in the first display region, each of the plurality of light-emitting units includes a first light-emitting unit and a second light-emitting unit adjacent to each other in the second direction;

a pixel circuit corresponding to one of the plurality of light-emitting units includes a first pixel circuit electrically connected to the first light-emitting unit and a
second pixel circuit electrically connected to the second
light-emitting unit;
the first pixel circuit and the second pixel circuit are
symmetric to each other about a symmetry axis extending in the first direction;
the display panel further includes power lines extending
in the first direction;
the pixel circuits include driving transistors;
the power lines are electrically connected to the driving
transistors for providing driving currents; and
in a pixel circuit for one of the plurality of light-emitting
units, the driving transistor of the first pixel circuit and
the driving transistor of the second pixel circuit are
electrically connected to one same power line.

* * * * *